(12) United States Patent
Jun et al.

(10) Patent No.: US 6,555,876 B2
(45) Date of Patent: Apr. 29, 2003

(54) THIN FILM TRANSISTOR ARRAY SUBSTRATE HAVING LASER ILLUMINATION INDICATOR

(75) Inventors: Sahng-Ik Jun, Seoul (KR); Yu-Ri Song, Seoul (KR); Woon-Yong Park, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/073,459

(22) Filed: Feb. 11, 2002

(65) Prior Publication Data

US 2003/0042482 A1 Mar. 6, 2003

(30) Foreign Application Priority Data

Aug. 30, 2001 (KR) .......................... 2001-52830

(51) Int. Cl.[7] .......................... H01L 27/01; H01L 27/12; H01L 31/0392
(52) U.S. Cl. .......................... 257/350; 257/59; 257/72; 257/797
(58) Field of Search .......................... 257/59, 72, 350, 257/797

(56) References Cited

U.S. PATENT DOCUMENTS 6,341,009 B1 * 1/2002 O'Connor et al. ............ 355/67
2002/0031017 A1 * 3/2002 Yumoto ...................... 365/200

* cited by examiner

*Primary Examiner*—Ngân V. Ngô
(74) *Attorney, Agent, or Firm*—F. Chau & Associates, LLP

(57) ABSTRACT

A thin film transistor array substrate includes an insulating substrate, and gate lines formed on the substrate, storage electrode lines and storage electrodes are also formed on the substrate. Data lines cross over the gate lines and the storage electrode lines. The data lines are electrically insulated from the gate lines and the storage electrode lines. Thin film transistors are connected to the data lines and the gate lines, and pixel electrodes are connected to the thin film transistors. Bridges are formed at the same plane as the pixel electrodes while interconnecting the storage electrode lines and the storage electrodes placed at both sides of the gate lines. The storage electrode lines and the storage electrodes have protrusions or grooves placed close to the bridges to indicate the locations of laser illumination.

21 Claims, 4 Drawing Sheets

THIN FILM TRANSISTOR ARRAY SUBSTRATE HAVING LASER ILLUMINATION INDICATOR

BACKGROUND OF THE INVENTION (a) Field of the Invention

The present invention relates to a thin film transistor array substrate and, more particularly, to a thin film transistor array substrate having a structure for laser repair.

(b) Description of the Related Art

Generally, a thin film transistor array substrate is used as a circuit substrate for independently driving the respective pixels in a liquid crystal display or an organic electro luminescence display. The thin film transistor array substrate typically has gate lines for transmitting scanning signals, data lines for transmitting image signals, thin film transistors connected to the gate lines and the data lines, pixel electrodes connected to the thin film transistors, a gate insulating layer covering the gate lines, and a passivation layer covering the thin film transistors and the data lines. Each thin film transistor includes a gate electrode connected to the gate line, a channel-forming semiconductor layer, a source electrode connected to the data line, a drain electrode connected to the pixel electrode, a gate insulating layer, and a passivation layer. The thin film transistor functions as a switching circuit where the image signal from the data line is transmitted to the pixel electrode in accordance with the scanning signal from the gate line.

In the thin film transistor array substrate, as each signal line is connected to each pixel column or each pixel row, each pixel has a thin film transistor, the respective line should be formed with a minute size of several micrometers or less. Therefore, in the process of fabricating the thin film transistor array substrate, there always exists a possibility of device failure due to a short or an open in the line. For this reason, a repair structure such as a repair ring is usually provided to the thin film transistor array substrate for repairing device failure. In a case of device failure, a failure line in the device is cut using a laser, or a repair structure is connected to the failure line.

Generally, repair of a device failure is preformed during a module fabrication process. For instance, in the case of a liquid crystal display, a thin film transistor array substrate is combined with a color filter substrate, and a liquid crystal is injected between the thin film transistor array substrate and the color filter substrate. Thereafter, the repair is preformed on the side of the thin film transistor array substrate not having a line assembly. That is, laser is illuminated through a rear surface of the thin film transistor array substrate to short(connect) or cut failure lines placed at the front surface thereof. This type of repair frequently fails to get desired result because an exact laser illumination location may not be easily found. Particularly, as a transparent conductive line based on indium tin oxide (ITO) or indium zinc oxide (IZO) is not easily discriminated through the rear surface of the thin film transistor array substrate, activation of a laser may illuminate unintended overlapping areas of the transparent conductive line with other lines, thereby the desired repair is not properly performed. Accordingly, a need exists for a thin film transistor array panel having a laser illumination indicator for easily and correctly repairing a device failure.

SUMMARY OF THE INVENTION

A thin film transistor array substrate is provided, which includes: an insulating substrate; a plurality of wiring lines formed on the insulating substrate; and a plurality of indicators formed on the plurality of wiring lines for indicating locations for laser illumination repair.

According to an embodiment of the present invention, the plurality of indicators are formed in the shape of protrusions or grooves. The plurality of wiring lines include a storage electrode line and a plurality of storage electrodes branched from the storage electrode. The plurality of indicators include at least two indicators separately formed on the storage electrode line and the plurality of storage electrodes. Preferably, each indicator has a length of about 4 $\mu$m to about 5 $\mu$m and a width of about 0.5 $\mu$m to about 1.5 $\mu$m.

A thin film transistor array substrate is also provided, which includes: a transparent insulating substrate; a first signal line formed on the insulating substrate; a second signal line formed on the insulating substrate, the second signal line crossing over the first signal line while being insulated from the first signal line; a signal line assembly including a base line and a plurality of branch lines branched from the base line, the base line crossing over the second signal line while being insulated from the second signal line; a bridge interconnecting parts of the signal line assembly placed at both sides of the first signal line while being insulated from the first signal line; a thin film transistor connected to the first and the second signal lines; and a pixel electrode connected to the thin film transistor, wherein the signal line assembly includes a plurality of indicators for indicating locations of laser illumination during repairing line failures at the first signal line or the second signal line.

According to an embodiment of the present invention, the plurality of indicators are formed in the shape of protrusions or grooves. The plurality of indicators include at least two indicators separately formed on the base line and the plurality of branch lines. Preferably, each indicator has a length of about 4 $\mu$m to about 5 $\mu$m and a width of about 0.5 $\mu$m to about 1.5 $\mu$m.

A thin film transistor array substrate is also provided, which includes: an insulating substrate; a gate line assembly formed on the insulating substrate, the gate line assembly including a gate line extending in the horizontal direction and a gate electrode connected to the gate line; a storage electrode line assembly formed on the insulating substrate, the storage electrode line assembly including a storage electrode line extending parallel to the gate line, and a plurality of storage electrodes branched from the storage electrode line while extending in the vertical direction; a gate insulating layer covering the gate line assembly and the storage electrode line assembly; a semiconductor layer formed on the gate insulating layer while being partially overlapped with the gate electrode; a data line assembly including a data line formed on the gate insulating layer while extending in the vertical direction, a source electrode connected to the data line while being partially placed over the semiconductor layer, and a drain electrode facing the source electrode while being partially placed over the semiconductor layer; a passivation layer covering the data line assembly and the semiconductor layer having a first contact hole exposing the drain electrode, a second contact hole exposing the storage electrode, and a third contact hole exposing the storage electrode line; a pixel electrode formed on the passivation layer while being connected to the drain electrode through the first contact hole; and a bridge formed on the passivation layer while interconnecting the storage electrode and the storage electrode line placed at both sides of the gate line through the second and the third contact holes, wherein the plurality of storage electrodes and the storage electrode line include a plurality of indicators placed close to the second and the third contact holes for indicating locations of laser illumination for repairing line failures.

According to an embodiment of the present invention, the thin film transistor array substrate further includes a data metallic piece overlapped with the bridge and the gate line, the data metallic piece being connected to the bridge through fourth contact hole of the passivation layer. The plurality of indicators include at least two indicators separately formed on the storage electrode line and the plurality of storage electrodes. The plurality of indicators are located adjacent to the pixel electrode and the bridge.

A thin film transistor array substrate is also provided, which includes: an insulating substrate; a gate line assembly formed on the insulating substrate, the gate line assembly having a gate line extending in the horizontal direction, and a gate electrode connected to the gate line; a storage electrode line assembly formed on the insulating substrate, the storage electrode line assembly including a storage electrode line extending parallel to the gate line, and a plurality of storage electrodes branched from the storage electrode line while extending in the vertical direction; a gate insulating layer covering the gate line assembly and the storage electrode line assembly; a semiconductor layer formed on the gate insulating layer while being partially overlapped with the gate electrode; a data line assembly including a data line formed on the gate insulating layer while extending in the vertical direction, a source electrode connected to the data line while being partially placed over the semiconductor layer, and a drain electrode partially placed on the semiconductor layer while facing the source electrode; a passivation layer covering the data line assembly and the semiconductor layer, the passivation layer having first contact hole exposing the drain electrode, second contact hole exposing the storage electrode, and third contact hole exposing the storage electrode line; a pixel electrode formed on the passivation layer, the pixel electrode being connected to the drain electrode through the first contact hole; and a bridge formed on the passivation layer while interconnecting the storage electrode and the storage electrode line placed at both sides of the gate line through the second and third contact holes; wherein a plurality of indicators are provided between the portions of the storage electrode line and the storage electrode overlapped with the bridge, and the portion of the storage electrode line and the storage electrode overlapped with the pixel electrode.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
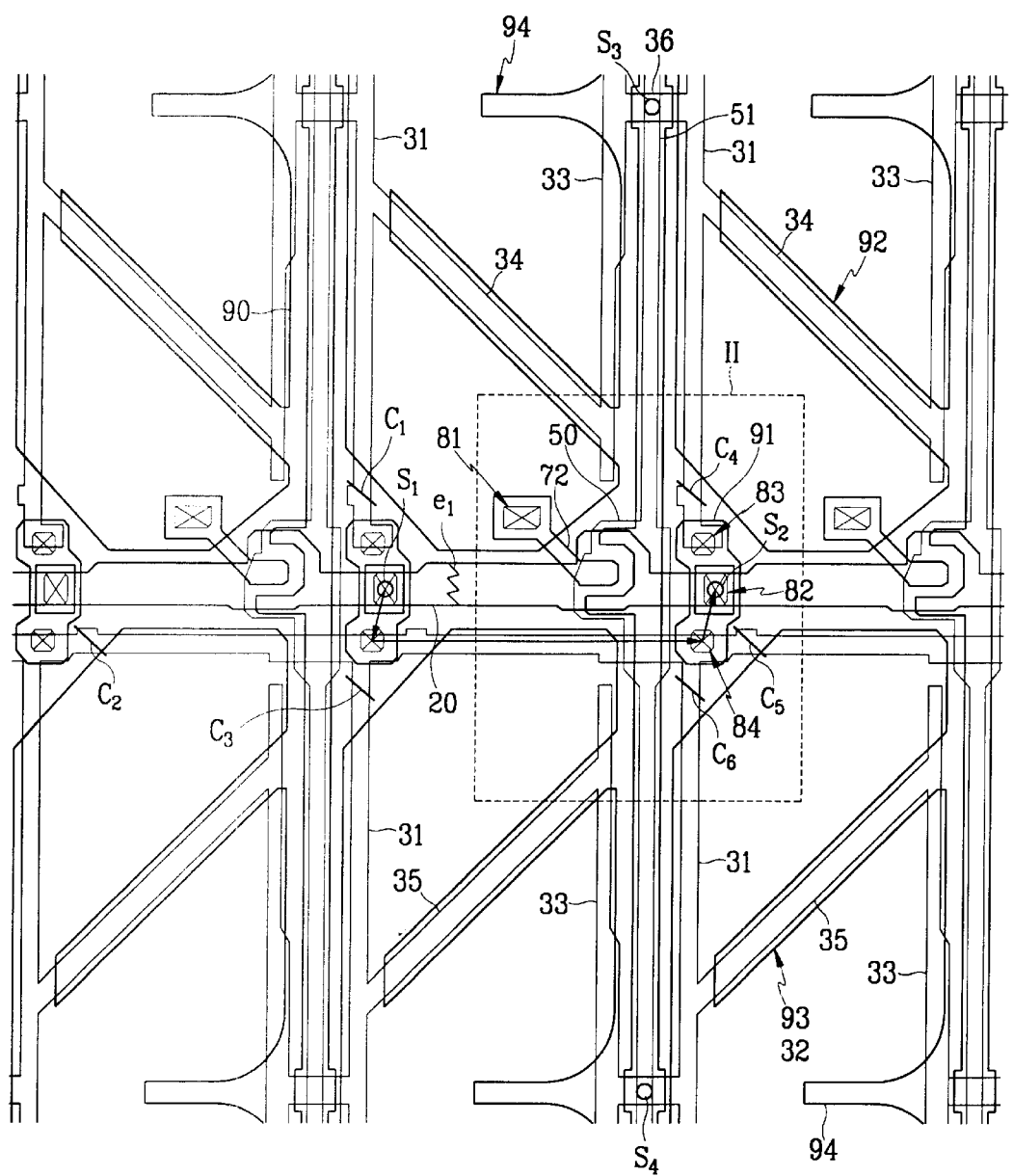
FIG. 1 is a plan view of a thin film transistor array substrate according to a preferred embodiment of the present invention.

The features and advantages of the present invention will become more apparent from the detailed description of preferred embodiments with reference to the accompanying drawings, like reference numerals are used for description of like or equivalent parts or portions for simplicity of illustration and explanation.

Figure 2:
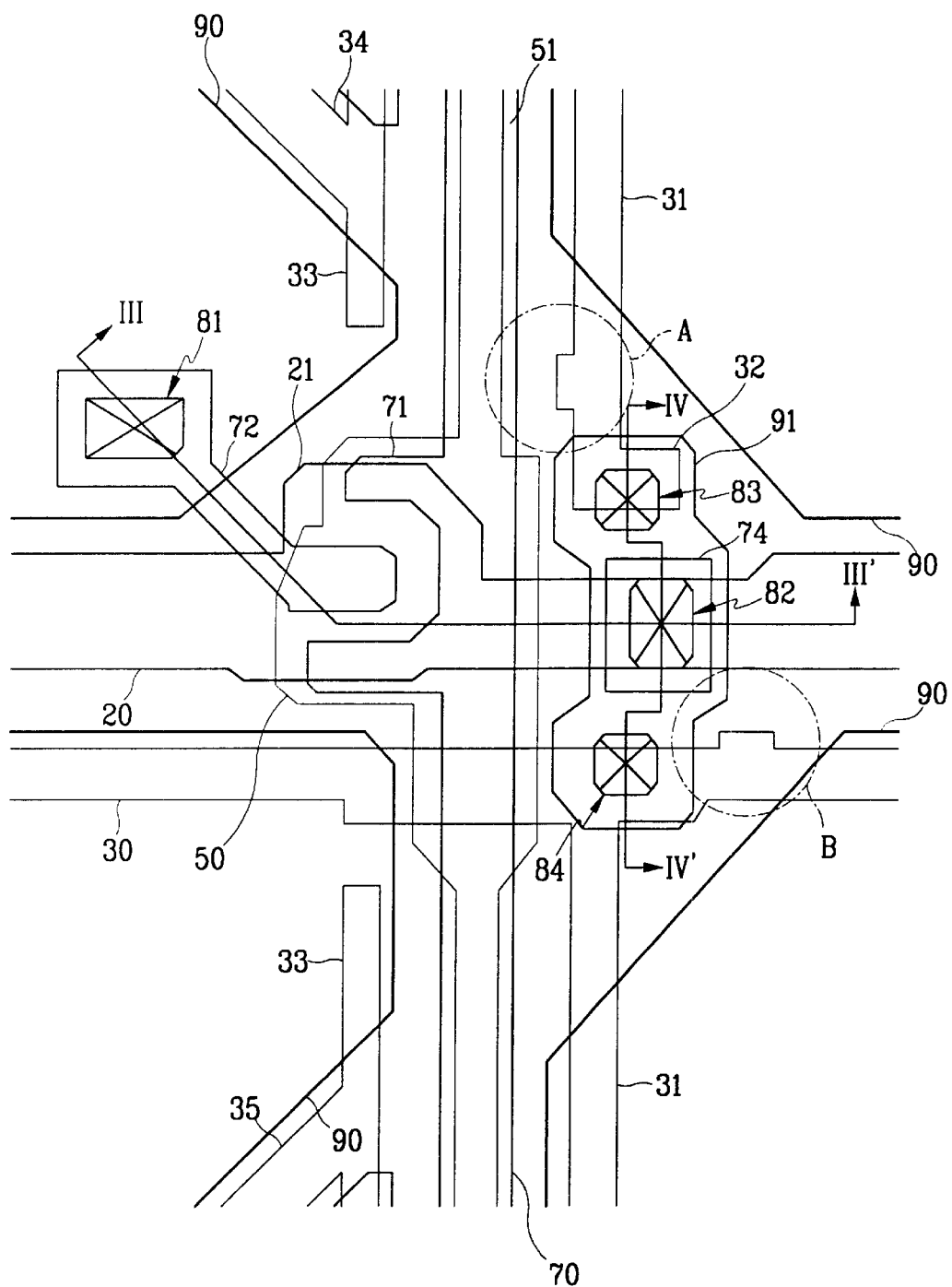
FIG. 2 is a magnified view of the region II of FIG. 1.
Figure 3:
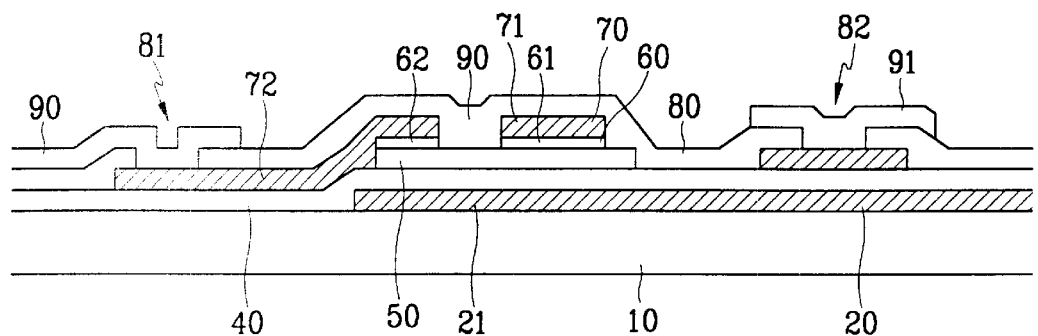
FIG. 3 is a cross sectional view of the thin film transistor array substrate taken along the III—III' line of FIG. 2.
Figure 4:
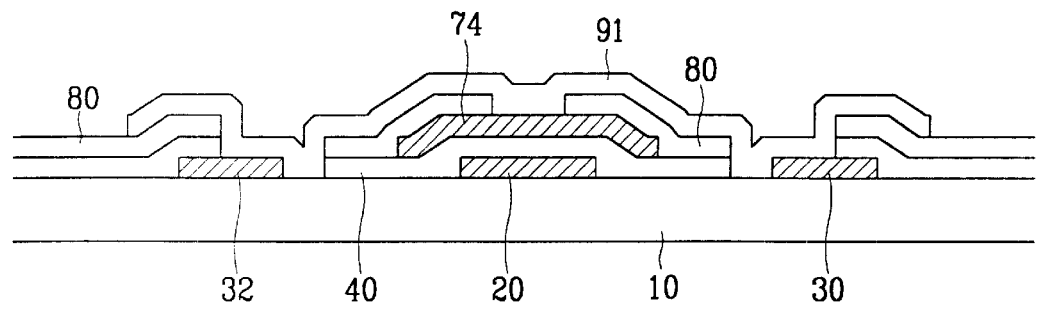
FIG. 4 is a cross sectional view of the thin film transistor array substrate taken along the IV—IV' line of FIG. 2.

FIG. 1 is a plan view of a thin film transistor array substrate according to a first embodiment of the present invention, FIG. 2 is a magnified view of the region II of FIG. 1, FIG. 3 is a cross sectional view of the thin film transistor array substrate taken along the III—III' line of FIG. 2, and FIG. 4 is a cross sectional view of the thin film transistor array substrate taken along the IV—IV' line of FIG. 2.

Referring to FIGS. 1, 2, 3, and 4, a gate line assembly and a storage electrode line assembly are formed on a substrate 10 based on a transparent insulating material such as glass or the like. The gate line assembly includes a gate line 20 extending in a horizontal direction, and a gate electrode 21 protruded from the gate line 20 upward and downward. The storage electrode line assembly includes a storage electrode line 30 formed in parallel to the gate line 20, and first to fifth storage electrodes 31–35 branched from the storage electrode line 30. The first storage electrode 31 is positioned at a peripheral region of a pixel region of the substrate 10, and connected directly to the storage electrode line 30 at one of its ends while extending in a vertical direction. The second storage electrode 32 is connected to the other end of the first storage electrode 31 in the form of protrusion. The third storage electrode 33 is positioned at the peripheral region of the pixel region opposite to the first storage electrode 31 while extending in a vertical direction, and connected to the first storage electrode 31 at a neighboring pixel region through a storage electrode connector 36. The fourth and the fifth storage electrodes 34 and 35 interconnect the first and the third storage electrodes 31 and 33 while extending at an angle or sloped direction. The fourth storage electrode 34 extends from the right bottom to the left center, and the fifth storage electrode 35 extends from the right top to the left center. The fourth and the fifth storage electrodes 34 and 35 are angled to each other by about 90°.

A gate insulating layer 40 covers the gate line assembly and the storage electrode line assembly, and a semiconductor layer is formed on the gate insulating layer 40. Preferably, the semiconductor layer is formed with amorphous silicon. The semiconductor layer includes a vertical portion 50 longitudinally extended over the storage electrode connector 36 while extending in the vertical direction, and a channel portion 51 overlapped with the gate electrode 21. Ohmic contact layers 60, 61, and 62 are formed on the semiconductor layer with amorphous silicon where n-type impurities such as phosphorous are doped at high concentration.

A data line assembly is formed on the ohmic contact layers 60–62 and the gate insulating layer 40. The data line assembly includes a data line 70 extending along the vertical portion 50 of the semiconductor layer, a source electrode 71 connected to the data line 70, and a drain electrode 72 separated from the source electrode 71. The source electrode 71, preferably having U-shape, is protruded from the data line 70 around the gate electrode 21. One end of the drain electrode 72 is extended toward the center of the U-shaped portion of the source electrode 71, and the other end thereof is extended toward the inside of the pixel region. The data line assembly further includes a data metallic piece 74 positioned over the gate line 20 around the second storage electrode 32. The ohmic contact layers 60–62 are formed only at the overlapping area of the semiconductor layer and the data line assembly.

A passivation layer 80 is formed on the data line assembly. The passivation layer 80 has a first contact hole 81 exposing the one end of the drain electrode 72, a second contact hole 82 exposing the data metallic piece 74, and a third and a fourth contact holes 83 and 84 partially exposing the second storage electrode 32 and the storage electrode line 30 together with the gate insulating layer 40 while being positioned above and below the second contact hole 82, respectively.

A pixel electrode 90 is formed on the passivation layer 80 such that they are connected to the drain electrodes 72 through the first contact holes 81. A bridge 91 is also formed on the passivation layer 80 such that the bridge 91 is connected to the data metallic piece 74 through the second contact hole 82, and to the second storage electrode 32 and the storage electrode line 30 through the third and fourth contact holes 83 and 84, respectively. The pixel electrode 90 and the bridge 91 are preferably formed with a transparent conductive material such as indium tin oxide (ITO) or indium zinc oxide (IZO). The pixel electrode 90 has first to third opening portions 92, 93, and 94. The first and the second opening portions 92 and 93 are overlapped with the fourth and the fifth storage electrodes 34 and 35, respectively. The third opening portion 94 is placed between the first and the second opening portions 92 and 93 while extending from the right side of the pixel electrode 90 to the left side thereof. The inlet edge of the third opening portion 94 is smoothly curved.

Meanwhile, indicators A and B are formed on the first storage electrodes 31 and the storage electrode lines 30, respectively, in the form of protrusion. The indicators A and B serve to mark or indicate locations for laser illumination when the line is in need of repair. According to a preferred embodiment of the present invention, the indicators A and B are located adjacent to the pixel electrode 90 or the bridge 91. In these locations, when the laser illumination is slightly deviated from a target area, the pixel electrode 90 and the bridge 91 can be damaged, or short-circuited with other lines. Furthermore, the indicators A and B are preferably formed at the portions that cannot be well distinguished from other portions due to the presence of transparent patterns, or other factors. The locations of the indicators A and B are to be cut by laser illumination when the line failure is repaired. The indicators A and B are preferably formed of a length of about 4 $\mu$m to about 5 $\mu$m, (in the longitudinal direction of the storage electrode line 30 or the first storage electrode 31) and a width of about 0.5 $\mu$m to about 1.5 $\mu$m (in the width direction of the storage electrode line 30 or the first storage electrode 31). This dimension is preferably decided in consideration of an area (3×3 $\mu$m) of the laser beam to be illuminated, and an inter-layered overlapping margin, that is, in consideration of the overlapping width of about 2.5 $\mu$m to about 3 $\mu$m of layer patterns being variable due to the alignment error of a photoresist mask during forming an each layer.

A method of repairing a line failure made on the above-structured thin film transistor array substrate will now be explained.

Assume that a gate line 20 is broken. As shown in FIG. 1, when the gate line 20 is broken at the e1 portion, laser is illuminated onto the overlapping portions s1 and s2 of the data metallic piece 74 placed at both sides of the e1 portion and the gate line 20 to thereby short-circuit or electrically connect the data metallic piece 74 with the gate line 20. Consequently, the bridges 91 placed at both sides of the e1 portion are short-circuited with the gate line 20. Thereafter, laser is illuminated onto the portions of c1, c2, c3, c4, c5, and c6 around the bridges 91 short-circuited with the gate line 20 to thereby cut the storage electrode line 30 and the first storage electrode 31. With the c1 portion, the second storage electrode 32 connected to the bridge 91 placed at the left side of the e1 portion is separated from the first storage electrode 31. The c1 portion is a part of the first storage electrode 31 disposed between the pixel electrode 90 and the bridge 91. The c2 portion is an indicator B of the storage electrode line 30 placed at the left side of the fourth contact hole 84 that is in turn placed at the left side of the e1 portion. The c3 portion is a beginning part of the first storage electrode 31 directly connected to the bottom of the fourth contact hole 84 that is placed at the left side of the e1 portion. The c4 portion is a part of the first storage electrode 31 positioned between the pixel electrode 90 and the bridge 91. With the c4 portion, the second storage electrode 32 connected to the bridge 91 placed at the right side of the e1 portion is separated from the first storage electrode 31. The c5 portion is an indicator B of the storage electrode line 30 placed at the right side of the fourth contact hole 84 that is in turn placed at the right side of the e1 portion. The c6 portion is a beginning part of the first storage electrode 31 connected to the bottom of the fourth contact hole 84 that is placed at the right side of the e1 portion.

In the above structure, a scanning signal can be transmitted through the course (indicated by the-arrow): via the bridge 91 and the storage electrode line 30 while bypassing the failed portion of the gate line 20. For example, the scanning signal can be transmitted through the gate line 20, the s1 portion, the bridge 91 connected to the gate line 20 via the s1 portion at the left side of the e1 portion, the storage electrode line 30, the bridge 91 connected to the storage electrode line 30 at the right side of the e1 portion, the s2 portion, and the gate line 20. Furthermore, as each component of the storage electrode line assembly such as the storage electrode line 30, and the first to the fifth storage electrodes 31–35 is connected to each other via the bridges 91, even though one component thereof are broken, other components can perform the function of the storage electrode line assembly. According to this method, the common electrode electric potential is still applied to the normal components of the storage electrode line assembly such that they form storage electrodes in relation to the pixel electrodes 90.

Meanwhile, the s1 and s2 portions among the laser illumination points s1, s2, c1, c2, c3, c4, c5, and c6 can be easily distinguished even from the rear side of the thin film transistor array substrate since opaque patterns of the gate line 20 and the data metallic piece 74 are crossed at the s1 and s2 portions of laser illumination. Furthermore, as the first storage electrode 31 is branched first the storage electrode line 30 close to the c3 and c6 portions, the c3 and c6 portions can be also easily discriminated even though the c3 and c6 portions do not have protrusion-shaped indicator. However, if the c1, c2, c4, and c5 portions cannot be easily distinguished without the presence of the protrusion-shaped indicators A and B, the laser can illuminate the neighboring pixel electrode 90 or bridge 91. That is, as those portions are proximally disposed to the invisible patterns of the pixel electrode 90 and the bridge 91, the laser illumination may miss the target area. Therefore, indicators formed, for example, at the c3 and c6 portions solve such problems.

Figure 5:
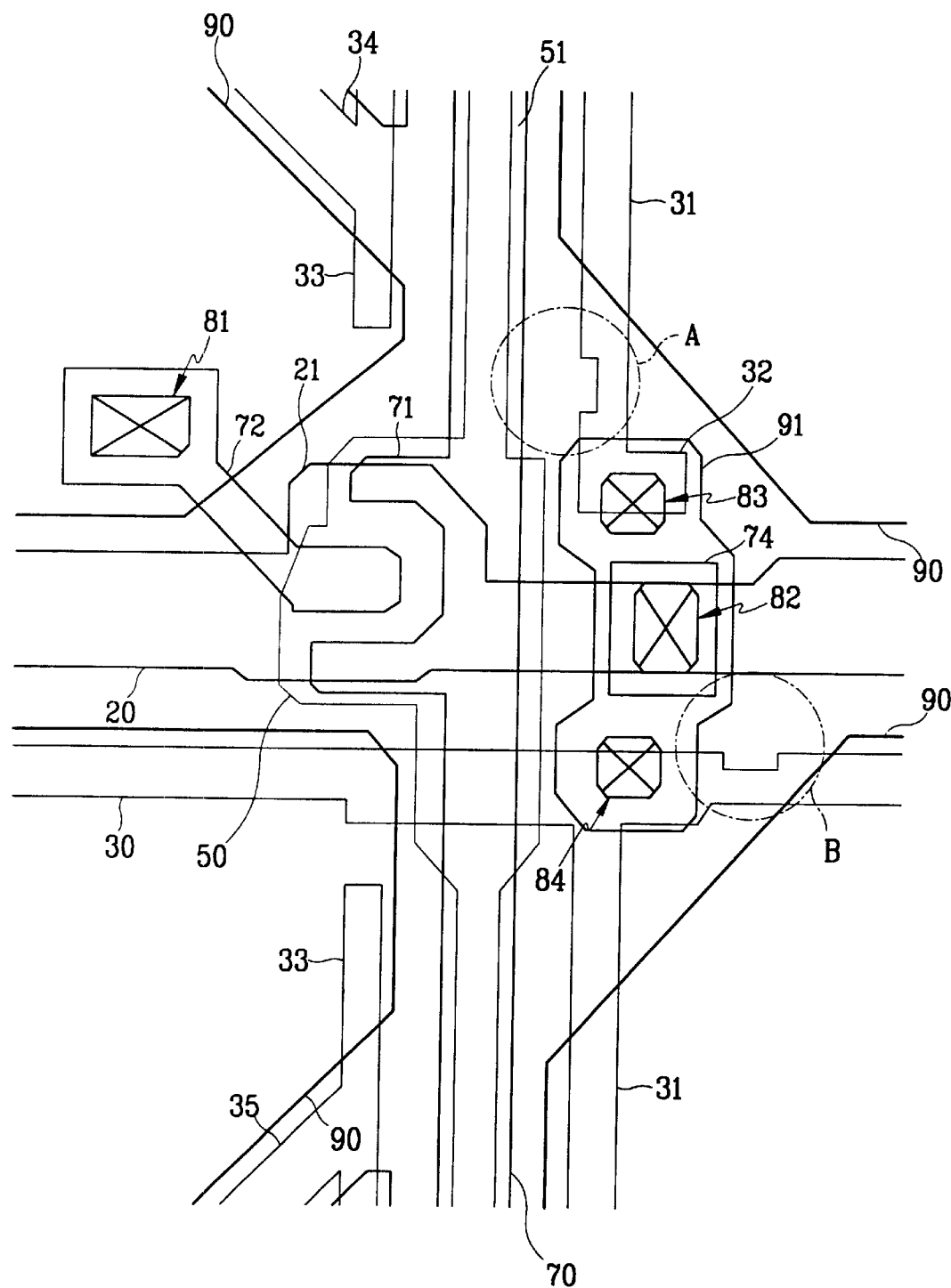
FIG. 5 is a plan view of a thin film transistor array substrate according to another preferred embodiment of the present invention.

FIG. 5 is a plan view of a thin film transistor array substrate according to a second embodiment of the present invention.

In this preferred embodiment, components and structures of the thin film transistor array substrate are similar as those related to the first embodiment except for the shapes of the indicators A and B. According to thee second embodiment of the present invention, the indicators A and B are formed in the shape of grooves.

The indicators A and B can have various shapes in addition to the shape of protrusion or groove. Also, the width of the wiring lines can be altered. Furthermore, the portions to be cut for repairing of the device failure can be formed in the shape of a groove, and the portions to be short-circuited can be formed in the shape of a protrusion.

As described above, indicators are formed at the locations of laser illumination to repair possible device failure so that the desired repairing can be performed in a correct manner.

While the present invention has been described in detail with reference to the preferred embodiments, those skilled in the, art will appreciate that various modifications and substitutions can be made thereto without departing from the spirit and scope of the present invention as set forth in the appended claims.

What is claimed is:

1. A thin film transistor array substrate comprising:
   an insulating substrate;
   a plurality of wiring lines formed on the insulating substrate; and
   a plurality of indicators formed on the plurality of wiring lines for indicating locations for laser illumination repair.

2. The thin film transistor array substrate of claim 1, wherein the plurality of indicators are formed in the shape of protrusions.

3. The thin film transistor array substrate of claim 1, wherein the plurality of indicators are formed in the shape of grooves.

4. The thin film transistor array substrate of claim 1, wherein the plurality of wiring lines comprise a storage electrode line and a plurality of storage electrodes branched from the storage electrode line.

5. The thin film transistor array substrate of claim 4, wherein the plurality of indicators include at least two indicators separately formed on the storage electrode line and the plurality of storage electrodes.

6. The thin film transistor array substrate of claim 1, wherein each indicator has a length of about 4 µm to about 5 µm and a width of about 0.5 µm to about 1.5 µm.

7. A thin film transistor array substrate comprising:
   a transparent insulating substrate;
   a first signal line formed on the insulating substrate;
   a second signal line formed on the insulating substrate, the second signal line crossing over the first signal line while being insulated from the first signal line;
   a signal line assembly including a base line and a plurality of branch lines branched from the base line, the base line crossing over the second signal line while being insulated from the second signal line;
   a bridge interconnecting parts of the signal line assembly placed at both sides of the first signal line while being insulated from the first signal line;
   a thin film transistor connected to the first and the second signal lines; and
   a pixel electrode connected to the thin film transistor,
   wherein the signal line assembly includes a plurality of indicators for indicating locations of laser illumination during repairing line, failures at the first signal line or the second signal line.

8. The thin film transistor array substrate of claim 7, wherein the plurality of indicators are formed in the shape of protrusions.

9. The thin film transistor array substrate of claim 7, wherein the plurality of indicators are formed in the shape of grooves.

10. The thin film transistor array substrate of claim 7, wherein the plurality of indicators include at least two indicators separately formed on the base line and the plurality of branch lines.

11. The thin film transistor array substrate of claim 7, wherein each indicator has a length of about 4 µm to about 5 µm and a width of about 0.5 µm to about 1.5 µm.

12. A thin film transistor array substrate comprising:
    an insulating substrate;
    a gate line assembly formed on the insulating substrate, the gate line assembly including a gate line extending in the horizontal direction and a gate electrode connected to the gate line;
    a storage electrode line assembly formed on the insulating substrate, the storage electrode line assembly including a storage electrode line extending parallel to the gate line, and a plurality of storage electrodes branched from the storage electrode line while extending in the vertical direction;
    a gate insulating layer covering the gate line assembly and the storage electrode line assembly;
    a semiconductor layer formed on the gate insulating layer while being partially overlapped with the gate electrode;
    a data line assembly including a data line formed on the gate insulating layer while extending in the vertical direction, a source electrode connected to the data line while being partially placed over the semiconductor layer, and a drain electrode facing the source electrode while being partially placed over the semiconductor layer;
    a passivation layer covering the data line assembly and the semiconductor layer having a first contact hole exposing the drain electrode, a second contact hole exposing the storage electrode, and a third contact hole exposing the storage electrode line;
    a pixel electrode formed on the passivation layer while being connected to the drain electrode through the first contact hole; and
    a bridge formed on the passivation layer while interconnecting the storage electrode and the storage electrode line placed at both sides of the gate line through the second and the third contact holes,
    wherein the plurality of storage electrodes and the storage electrode line include a plurality of indicators placed close to the second and the third contact holes for indicating locations of laser illumination for repairing line failures.

13. The thin film transistor array substrate of claim 12, further comprising a data metallic piece overlapped with the bridge and the gate line, the data metallic piece being connected to the bridge through fourth contact hole of the passivation layer.

14. The thin film transistor array substrate of claim 12, wherein the plurality of indicators are formed in the shape of protrusions.

15. The thin film transistor array substrate of claim 12, wherein the plurality of indicators are formed in the shape of grooves.

16. The thin film transistor array substrate of claim 12, wherein the plurality of indicators include at least two indicators separately formed on the storage electrode line and the plurality of storage electrodes.

17. The thin film transistor array substrate of claim 12, wherein the plurality of indicators are located adjacent to the pixel electrode and the bridge.

18. The thin film transistor array substrate of claim 12, wherein each of the indicators has a length of about 4 μm to about 5 μm and a width of about 0.5 μm to about 1.5 μm.

19. A thin film transistor array substrate comprising:

an insulating substrate;

a gate line assembly formed on the insulating substrate, the gate line assembly having a gate line extending in the horizontal direction, and a gate electrode connected to the gate line;

a storage electrode line assembly formed on the insulating substrate, the storage electrode line assembly including a storage electrode line extending parallel to the gate line, and a plurality of storage electrodes branched from the storage electrode line while extending in the vertical direction;

a gate insulating layer covering the gate line assembly and the storage electrode line assembly;

a semiconductor layer formed on the gate insulating layer while being partially overlapped with the gate electrode;

a data line assembly including a data line formed on the gate insulating layer while extending in the vertical direction, a source electrode connected to the data line while being partially placed over the semiconductor layer, and a drain electrode partially placed on the semiconductor layer while facing the source electrode;

a passivation layer covering the data line assembly and the semiconductor layer, the passivation layer having first contact hole exposing the drain electrode, second contact hole exposing the storage electrode, and third contact hole exposing the storage electrode line;

a pixel electrode formed on the passivation layer, the pixel electrode being connected to the drain electrode through the first contact hole; and a bridge formed on the passivation layer while interconnecting the storage electrode and the storage electrode line placed at both sides of the gate line through the second and third contact holes;

wherein a plurality of indicators are provided between the portions of the storage electrode line and the storage electrode overlapped with the bridge, and the portion of the storage electrode line and the storage electrode overlapped with the pixel electrode.

20. The thin film transistor array substrate of claim 19, wherein the plurality of indicators are formed at the signal line assembly in the shape of protrusions.

21. The thin film transistor array substrate of claim 19, wherein the plurality of indicators are formed at the signal line assembly in the shape of grooves.

* * * * *